United States Patent [19]
Hung et al.

[11] Patent Number: 5,883,919
[45] Date of Patent: Mar. 16, 1999

[54] DIFFUSION FURNACE SYSTEM FOR PREVENTING GAS LEAKAGE

[75] Inventors: Cheng-Chang Hung, Tainan; Lien-Fang Lin, Chiayi Hsien, both of Taiwan

[73] Assignee: Vanguard International Semiconductor Corporation, Hsinchu, Taiwan

[21] Appl. No.: 859,007

[22] Filed: May 20, 1997

[51] Int. Cl.⁶ .................................................. F27D 7/06
[52] U.S. Cl. .................. 373/112; 373/5; 373/8; 219/390; 432/239; 266/257
[58] Field of Search .................. 373/109–112, 116, 373/135–136, 5, 8; 219/390–400; 266/249, 257; 432/5, 239

[56] References Cited
U.S. PATENT DOCUMENTS 5,447,294  9/1995  Sakata et al. ........................... 266/257

Primary Examiner—Tu Ba Hoang
Attorney, Agent, or Firm—Christensen O'Connor Johnson & Kindness PLLC

[57] ABSTRACT

A furnace system for preventing gas leakage is disclosed. The furnace system includes a bottom board for holding a furnace tube. A gas injection device is connected to the furnace tube at a first port for injecting reaction gas into the furnace tube. An exhaust subsystem is connected to the furnace tube at a second port. The exhaust subsystem has a first node, a second node, a third node and a fourth node. A vacuum seal is connected to the furnace tube at a third port for preventing the exhaust gas from leaking. The vacuum seal is connected to the exhaust subsystem at the first node and the second node. Finally, an $N_2$ sealing tube is connected to furnace tube and surrounding the seam between the furnace tube and the bottom board.

6 Claims, 2 Drawing Sheets

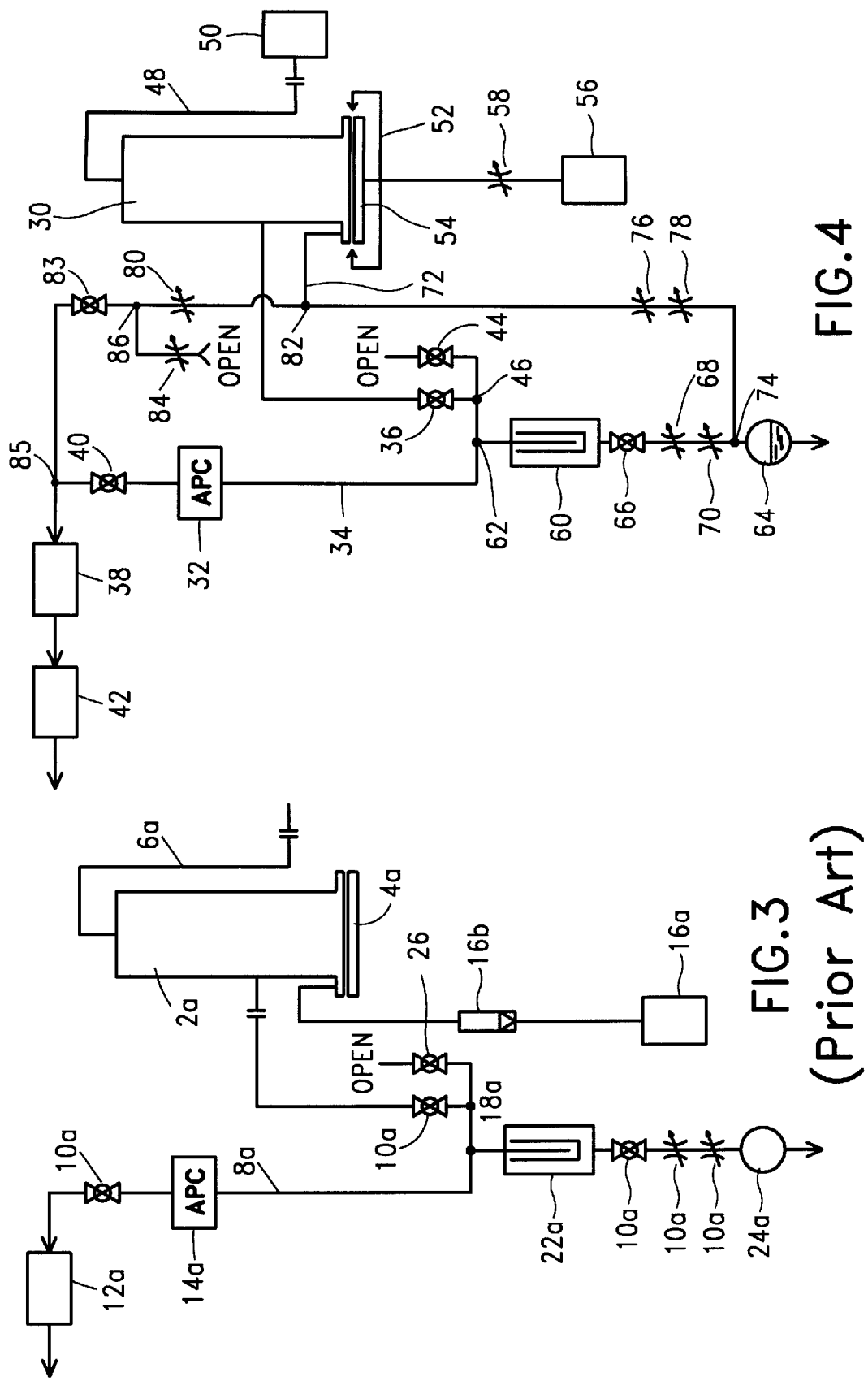

DIFFUSION FURNACE SYSTEM FOR PREVENTING GAS LEAKAGE

TECHNICAL FIELD OF THE INVENTION

The present invention relates to semiconductor furnaces, and more particularly, to an improved furnace to prevent HCl leakage.

BACKGROUND OF THE INVENTION

The semiconductor furnace plays an important role in the semiconductor manufacturing process. Common processes such as oxidation, diffusion, chemical vapor deposition, and annealing are performed in a furnace. A typical type of furnace used is the so called "lamp annealing" furnace. The lamp annealing furnace has the advantage that a plurality of wafers can be treated and the process temperature can be precisely controlled. However, the lamp annealing furnace does not currently provide uniform temperature distribution over the entire wafer surface. Another popular type of furnace used in the semiconductor manufacture is the "hot wall" furnace. There are two types of "hot wall" furnace. One is the hot wall horizontal diffusion furnace which is capable of controlling temperature over the range of 300°–1200° C. to an accuracy of 0.5 or –0.5° C. over a length of up to 40 inches.

Another type is the vertical furnace system. The major advantage of the vertical furnace system offers over a conventional system are (1) no cantilever or soft-landing is required since the wafers are held in a quartz boat which does not touch the process tube walls (2) the wafers can be loaded and unloaded automatically. (3) batch processes can be run in the same process tube. (4) temperature is more stable than other type.

In VLSI fabrication, the accurate control of layer thickness and reduction of defects are more important than ever. Many semiconductor processes are performed in a furnace such as oxidation, thermal annealing, deposition, etc . . . . Typically, one or more kinds of gases have to be injected into a furnace system. For example, in a thermal oxidation process, oxygen is injected into the furnace so that the wafer is kept in an oxygen ambient.

In addition, some of the processes are related to the reaction of oxygen and $C_2H_2Cl_2$. It is a relatively simple reaction as shown below:

at 700° C.

$C_2H_2Cl_2$ (gas) + $2O_2$ (gas) ⟶ $2HCl$ (gas) + $2CO_2$ (gas)

The gases that are generated during the process are HCl and $CO_2$. HCl is a poisonous gas that is extremely harmful to humans.

FIG. 1 shows in schematic form a conventional furnace system. A furnace tube 2 is used for process reaction that is set on a bottom board 4. The bottom board is used for setting a boat. Typically, wafers are transferred into the boat. A gas injection pipe 6 is connected to the furnace tube 2. The unreacted input gas is let through the pipe 6 into the furnace tube 2. An exhaust pipe 8 having a valve 10 is connected to the furnace tube 2 via a process gas exhaust pipe 26. The waste gas that is generated by a process is exhausted via the exhaust pipe 8 to an exhaust scrubber 12.

An automatic pressure controller (APC) 14 is set midway of the exhaust pipe 8 between the furnace tube 2 and the exhaust scrubber 12 and is used for maintaining and controlling the air pressure at a predetermined level inside the exhaust pipe 8 and the furnace tube 2. Valve 10 that is connected to the APC 14 is used to adjust the flow rate of the exhaust in the exhaust pipe 8. The APC 14 includes a sensor for monitoring the pressure inside the pipe 8. The mechanism of the APC 14 is controlled in accordance with the signal detected by the pressure sensor. For example, a value of air pressure is reached higher than –10 mm $H_2O$, the valve 10 will be responsive to the pressure and automatically opened. When the pressure approaches lower than –10 mm $H_2O$, the valve 10 will be automatically closed the opening of the valve 10 a little in order to release exhaust out of the furnace tube 2 and keep the air pressure at the valve of –10 mm $H_2O$.

In general, if the pressure inside the furnace tube 2 is higher than the pressure outside the furnace, then gas inside the furnace 2 will tend to leak out of the furnace tube 2 via the seam between the furnace tube 2 and the bottom board 4. Therefore, a vacuum seal 16 is attached to the bottom board 4 to prevent the gas from leaking. Typically, the vacuum seal 16 is connected to the exhaust pipe 8 at a node 17 via a vacuum seal pipe 20. A valve 10 is located midway between the node 17 and the bottom board 4 on the pipe 20. Another element of the furnace system is a water collector 22 located between the node 18 and a drain assembly 24. The water collector 22 is used to collect condensed water. The water also serves the dual purpose of being a pressure barrier. When water is collected by the water collector 22, gas cannot be exhausted from the drain assembly 24. A valve 10 is also typically located between the water collector 22 and the drain assembly 24.

In order to prevent the gas inside the furnace from leaking, the process gas exhaust pipe 26 has to provide a negative pressure into the furnace. However, the air pressure close to the process gas exhaust pipe 26 is very unstable due to the unstable air pressure inside the exhaust pipe 8. The variation of the air pressure is in the range of –10 mm $H_2O$ to 0 mm $H_2O$. Therefore, the furnace pressure near the vacuum seal 16 is unstable between negative pressure and positive pressure. If the pressure reaches the positive pressure, then the gas will leak out of the furnace.

Another type of prior art furnace system that is used to prevent gas leakage is shown in FIG. 2. The furnace system includes a furnace tube 2a set on a bottom board 4a. A gas injection pipe 6a is connected to the furnace tube 2a for injecting gas into the furnace tube 2a. An automatic pressure controller (APC) 14a is located midway between the furnace tube 2a and the exhaust scrubber 12a via exhaust pipe 8a for maintaining the air pressure inside the furnace tube 2a. A valve 10a that is connected to the APC 14a to adjust the flow rate of the exhaust in the exhaust pipe 8a. A water collector 22a is located between the APC 14a and a drain assembly 24a. Similarly, the water collector 22a is used to collect condensed water that is used as a barrier. An $N_2$ seal 16a is connected to the bottom board 4a for providing positive gas pressure into the furnace tube 2a in order to prevent gas leakage. Typically, the $N_2$ seal 16a is connected to a port 4b which is attached to the bottom board 4a. A flow meter 16b is connected to the $N_2$ seal 16a for controlling the flow rate of the $N_2$.

The $N_2$ is injected into the furnace tube 2a to generate a positive pressure near the bottom board 4a. This generally prevents the gas inside the furnace from leaking. Unfortunately, the injected $N_2$ is forced into the furnace only via the port 4b. This often times allows gas to still leak out of the furnace tube 2a from the seam disposed away from the port 4b.

Another modification of the furnace system with an $N_2$ seal is shown in FIG. 3. As can be seen, an open valve 26 is connected to the exhaust pipe 8*a* at node 18*a*. The open valve 26 will compensate for the pressure of process exhaust. Thus, air pressure variation will be reduced to the range of −9 mm H₂O to −11 mm H₂O. Although the modification can keep the gas exhaust pressure at the stable negative pressure. However, this design can not prevent the gas from leaking completely.

SUMMARY OF THE INVENTION

An exhaust system for a semiconductor furnace is disclosed. The furnace includes a bottom board and a furnace tube attached to the bottom board at a seam. The system comprises a main exhaust tube connected to said furnace tube at an exhaust port; an automatic pressure controller (APC) having an APC input and an APC output, said APC input connected to said main exhaust tube, said APC operative for maintaining the pressure inside said furnace tube; a liquid collector having a collector input and a collector output, said collector also connected to said main exhaust tube, said liquid collector for collecting condensed liquid for use as a barrier; a vacuum seal tube connected to said furnace tube at a vacuum port, said vacuum seal tube connecting to said APC output and also connecting to said collector output; and an N₂ sealing means connected to said furnace tube and said bottom board and surrounding said seam between said furnace tube and said bottom board, wherein said N₂ sealing means provides a positive pressure of N₂ onto said seam at substantially the entire seam.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a third furnace system formed in accordance with the prior art; and

FIG. 4 is a furnace system formed in accordance with the present invention.

DETAILED DESCRIPTION OF THE PREFERRED EMBODIMENT

Figure 2:
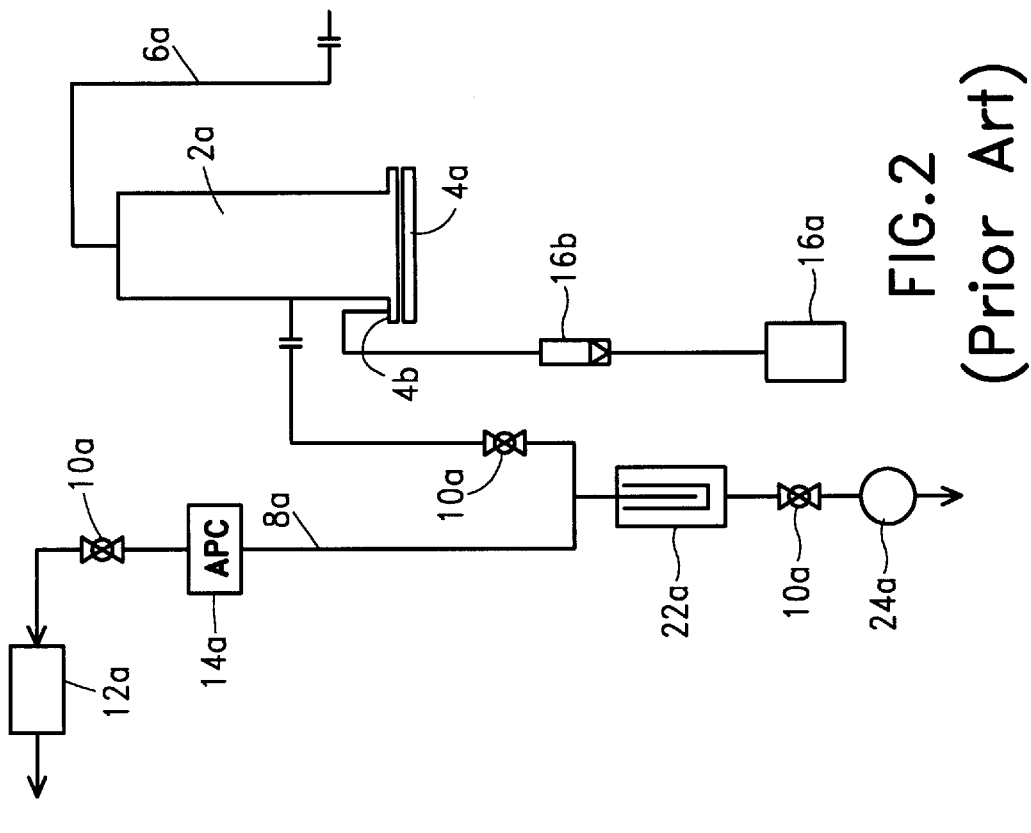
FIG. 2 is a second furnace system formed in accordance with the prior art.
Figure 1:
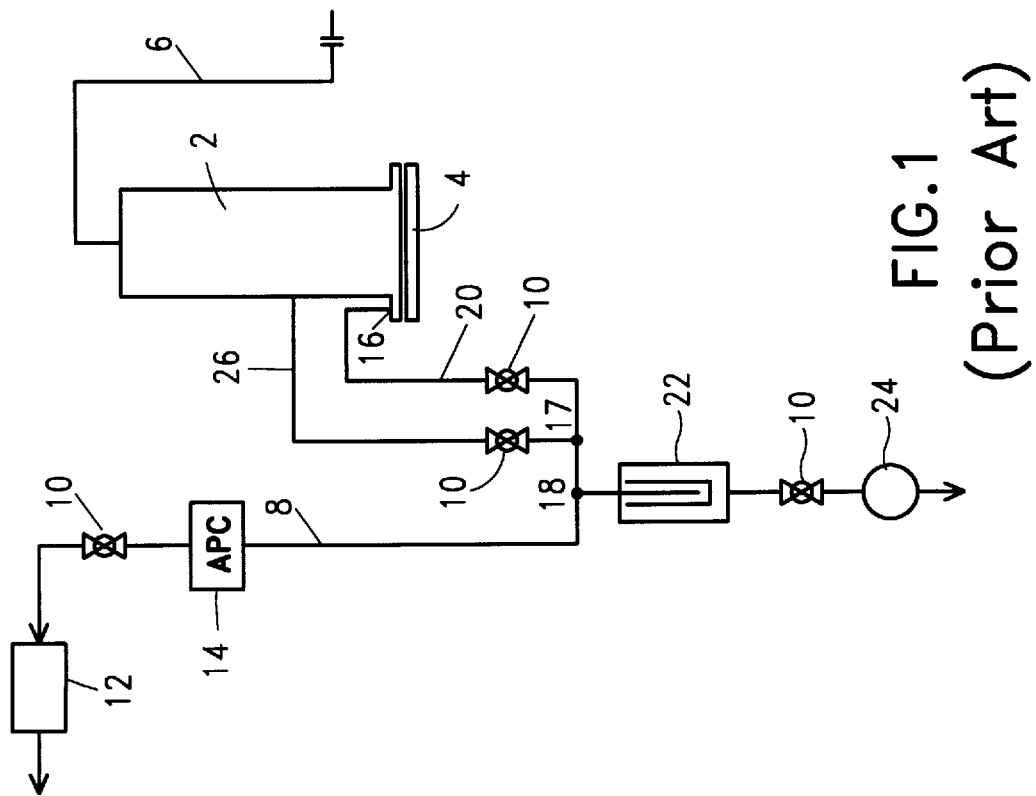
FIG. 1 is a furnace system formed in accordance with the prior art.

FIG. 4 shows a furnace system formed in accordance with the present invention. An automatic pressure controller (APC) 32 is connected to a process furnace tube 30 via an exhaust pipe 34. The APC is used for maintaining the air pressure inside the furnace tube 30. A valve 36 is located between the furnace tube 30 and the APC 32 to adjust the air flow rate of the process exhaust inside the exhaust pipe 34. A damper 38 is connected to the APC 32 to sever as a buffer. A second valve 40 is also used to adjust the air pressure of the exhaust inside the exhaust pipe 34. The second valve 40 is connected to the damper 38 via a node 85. Further, the second valve 40 is set between the APC 32 and the damper 38. A scrubber exhaust 42 is connected to the damper 38 to exhaust the process gas. An open valve 44 is attached to the exhaust pipe 34 at a node 46 to compensate for the pressure of process exhaust. In other words, the valve 44 has the function of roughly adjusting the exhaust pressure and absorbing any disturbance from the exhaust pressure.

A gas injection pipe 48 is connected to the furnace tube 30. The distal end of the gas injection pipe 48 leads to a source of gas 50 that is injected into the furnace tube 30 at a predetermined pressure. An N₂ seal 52 is attached to the bottom board 54. The bottom board is used to hold a wafer boat. Different from the prior art, the N₂ seal 52 surrounds the entire seam that is between the furnace tube 30 and the bottom board 54. Therefore, positive pressure is around the entire seam to prevent gas leakage. The distal end of the N₂ seal 52 leads to a nitrogen source 56. Between the nitrogen source 56 and the N₂ seal 52 is a third valve 58 to control the flow rate of the nitrogen.

A water collector 60 is connected to the exhaust pipe 34 at a node 62 to collect condensed water for use as a barrier. In the preferred embodiment, water collector 60 is formed in accordance with pending U.S. patent application Ser. No. 08/642,488 entitled "Furnace Exhaust System with Regulator" to Lin filed May 3, 1996, assigned to the assignee herein and expressly incorporated by reference. The node 62 is located between the node 46 and the APC 32. An acid drain assembly is connected to the water collector 60 for draining water and HCl. The assembly comprises a fourth valve 66, a fifth valve 68, a sixth valve 70 and a drain assembly 64. The fourth valve 66, fifth valve 68, and sixth valve 70 are located between the water collector 60 and a drain assembly 64. The fifth valve 68 and the sixth valve 70 serve as buffers to compensate for the pressure of process exhaust.

A vacuum seal 72 is attached to the furnace tube 30 via a port 74. The vacuum seal 72 provides negative pressure for avoiding gas leakage from the furnace tube 30. The distal end of the vacuum seal 72 leads to the drain assembly 64 by means of a node 74. The node 74 is set between the sixth valve 70 and the drain assembly 64. Further, a seventh valve 76 and an eighth valve 78 are located between the vacuum seal 72 and the drain assembly 64. The function of the seventh valve 76 and the eighth valve 78 serve as buffers to compensate for the pressure of process exhaust.

A ninth valve 80 is connected to the vacuum seal 72 at a node 82 for adjusting the pressure of the vacuum seal 72. The node 82 is set between the vacuum seal 72 and the seventh valve 76. This arrangement is operative because the vacuum seal 72 will not be directly influence by the exhaust inside the exhaust pipe 34. The distal end of the vacuum seal 72 leads to the damper 38. A tenth valve 83 is located between the ninth valve 80 and the damper 38. A second open valve 84 is also connected to the ninth valve 80 at node 86. Node 86 is located between the ninth valve 80 and the tenth valve 83. The second open valve 84 is used to compensate for the pressure of process exhaust and vacuum seal 72.

The vacuum seal 72 exhausts the gas from the bottom of furnace. The N₂ seal 52 are used to provide positive pressure to the bottom board 54 to prevent gas leakage. The arrangement of the present invention can avoid unstable pressure due to the direct disruption by the exhaust pressure. Further, the seam that is between the furnace tube 30 and the board 54 is surrounded by the N₂ seal 52 so that the gas will not leak from the furnace tube 30. In addition, the first and the second open valve 44 and 84 are used to compensate for the pressure of the process exhaust and provide a more stable pressure of the exhaust.

The scrubber exhaust 42 always keeps the vacuum condition at a pressure lower than −60 mm H₂O. The inner diameters of the valve 76 and valve 78 are limited to be about 1 mm. Therefore, the gas flow rate from drain assembly 64 to the vacuum seal 72 will be limited to a small value. The APC control the pressure of process exhaust pipe 34 before the APC reaches the preset value of −10 mm H₂O. In addition, the output of the APC has been kept at a negative pressure. Thus, the vacuum seal 72 is active by using scrubber exhaust via the damper 38, the valve 83 and the valve 80.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An exhaust system for a semiconductor furnace, said furnace including a bottom board and a furnace tube attached to said bottom board at a seam, said system comprising:
   a main exhaust tube connected to said furnace tube at an exhaust port;
   an automatic pressure controller (APC) having an APC input and an APC output, said APC input connected to said main exhaust tube, said APC operative for maintaining the pressure inside said furnace tube;
   a liquid collector having a collector input and a collector output, said collector also connected to said main exhaust tube, said liquid collector for collecting condensed liquid for use as a barrier;
   a vacuum seal tube connected to said furnace tube at a vacuum port, said vacuum seal tube connecting to said APC output and also connecting to said collector output; and
   an $N_2$ sealing means connected to said furnace tube and said bottom board and surrounding said seam between said furnace tube and said bottom board,
   wherein said $N_2$ sealing means provides a positive pressure of $N_2$ onto said seam at substantially the entire seam.

2. The system of claim 1 further including:
   a drain assembly connected to said liquid collector for draining said liquid;
   a damper connected to the APC output; and
   a scrubber connected to said dampler.

3. The system of claim 1, wherein said vacuum seal tube includes:
   a vacuum valve attached to said vacuum seal tube between said damper and said vacuum port for adjusting for the pressure of said vacuum seal bube; and
   at least one buffer valve attached to said vacuum seal tube between said drain assembly and said vacuum port for serving as buffers to compensate for the pressure of said vacuum seal bube.

4. The system of claim 1 wherein said $N_2$ sealing means further includes a buffer valve attached to said $N_2$ sealing means to prevent gas from leaking.

5. A furnace system for prevent gas from leakage, said system comprising:
   a bottom board for holding a wafer boat;
   a reaction furnace tube formed on said bottom board for holding a semiconductor process, said process generating a gas product;
   a gas injection means connected to said furnace tube at a first port for injecting reaction gas into said furnace tube;
   an exhausting subsystem connected to said furnace tube at a second port for exhausting, said exhausting subsystem having a first node, a second node, a third node and a forth node, said exhausting subsystem comprising:
   a first valve connected to second port for adjusting the air pressure of said process exhaust, said third node connected to said first valve;
   an air pressure controller (APC) connected to said third valve for maintaining the air pressure inside the furnace tube;
   a second valve connected to said APC for adjusting the air pressure of said process exhaust, said first node connected to said second valve;
   a damper connected to said first node for severing as a buffer;
   a scrubber connected to said damper for exhausting the process exhaust;
   a liquid collector connected to said third node for collecting condensed water for using as a barrier, said third node is located between said second port and said APC;
   a third valve connected to said liquid collector for adjusting drain rate of said liquid;
   a plurality of forth valves connected to said third valve for severing as buffers to compensate the pressure of process exhaust, said second node is connected to said forth valves;
   a drain assembly connected to said second node for draining said liquid;
   an first open valve connected said first valve via said forth node for compensating the pressure of said process exhaust, said forth node is located between said third node and said first valve;
   a vacuum sealing means connected to said furnace tube at a third port for preventing said gas product from leakage, said vacuum sealing means connecting to said exhausting subsystem via said first node and said second node, said vacuum sealing means having a fifth node and a sixth node, said vacuum sealing means comprising:
     (a) a fifth valve connected to said third port for severing as buffers to adjust the pressure of process exhaust, said fifth node is located between said third port and said fifth valve;
     (b) a second open valve connected to said fifth valve via said sixth node for compensating the pressure of said process exhaust, said sixth node is connected to said fifth valve;
     (c) a sixth valve connected to said sixth node for adjusting the air pressure of said process exhaust;
     (d) a plurality of seventh valves connected to said fifth node for severing as buffers to adjust the pressure of vacuum seal tube, said seventh valves is located between said second node and said fifth node; and
   a $N_2$ sealing means connected to said furnace tube and surrounding the seam between said furnace tube and said bottom board.

6. The system of claim 5, wherein said $N_2$ sealing means includes a valve attached to said $N_2$ sealing means for adjusting the flow rate of $N_2$.

* * * * *